United States Patent
Choi et al.

(10) Patent No.: US 9,671,686 B2
(45) Date of Patent: Jun. 6, 2017

(54) EXPOSURE METHODS USING E-BEAMS AND METHODS OF MANUFACTURING MASKS AND SEMICONDUCTOR DEVICES THEREFROM

(71) Applicants: Jin Choi, Yongin-si (KR); In-kyun Shin, Yongin-si (KR); Byoung-sup Ahn, Seongnam-si (KR); Sang-hee Lee, Seongnam-si (KR)

(72) Inventors: Jin Choi, Yongin-si (KR); In-kyun Shin, Yongin-si (KR); Byoung-sup Ahn, Seongnam-si (KR); Sang-hee Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 65 days.

(21) Appl. No.: 14/693,429

(22) Filed: Apr. 22, 2015

(65) Prior Publication Data

US 2015/0362834 A1   Dec. 17, 2015

(30) Foreign Application Priority Data

Jun. 12, 2014   (KR) .......................... 10-2014-0071485

(51) Int. Cl.
*G03F 1/78* (2012.01)
*G03F 1/36* (2012.01)

(52) U.S. Cl.
CPC . *G03F 1/78* (2013.01); *G03F 1/36* (2013.01)

(58) Field of Classification Search
USPC ......................................................... 716/53
See application file for complete search history.

(56) References Cited

U.S. PATENT DOCUMENTS

| 5,863,682 A | 1/1999 | Abe et al. |
| 7,178,127 B2 | 2/2007 | Abrams et al. |
| (Continued) | | |

FOREIGN PATENT DOCUMENTS

| JP | 03-249650 | 11/1991 |
| JP | 2584091 B2 | 2/1997 |
| (Continued) | | |

OTHER PUBLICATIONS

Chua et al., "Optimization of mask shot count using MB-MDP and lithography simulation", Bacus News, Nov. 2011, vol. 27, Issue 11, 12 pages.

(Continued)

*Primary Examiner* — Mohammed Alam
(74) *Attorney, Agent, or Firm* — Myers Bigel, P.A.

(57) ABSTRACT

Disclosed are an exposure method and a method of manufacturing a mask and a semiconductor device using the same, which minimize time taken by mask data preparation (MDP) to optimize a total exposure process and enhance a quality of a pattern by using an inverse solution concept, based on a multi-beam mask writer. The exposure method includes receiving mask tape output (MTO) design data obtained through optical proximity correction (OPC), preparing mask data, including a job deck, for the MTO design data without a data format conversion, performing complex correction, including proximity effect correction (PEC) of an error caused by an e-beam proximity effect and mask process correction (MPC) of an error caused by an exposure process, on the mask data, generating pixel data, based on data for which the complex correction is performed, and performing e-beam writing on a substrate for a mask, based on the pixel data.

7 Claims, 17 Drawing Sheets

(56) References Cited

U.S. PATENT DOCUMENTS

| | | |
|---|---|---|
| 7,463,173 B2 | 12/2008 | Sanmiya et al. |
| 7,879,627 B2 | 2/2011 | Ghinovker et al. |
| 7,899,953 B2 | 3/2011 | Inoue |
| 8,076,656 B2 | 12/2011 | Shibata |
| 8,103,980 B2 | 1/2012 | Emi et al. |
| 8,222,621 B2 | 7/2012 | Fragner et al. |
| 8,255,441 B2 | 8/2012 | Kasahara et al. |
| 8,258,488 B2 | 9/2012 | Platzgummer et al. |
| 8,278,635 B2 | 10/2012 | Platzgummer et al. |
| 8,304,749 B2 | 11/2012 | Platzgummer et al. |
| 8,378,320 B2 | 2/2013 | Platzgummer |
| 8,492,055 B2 | 7/2013 | Zable et al. |
| 8,635,562 B2 | 1/2014 | Sahouria |
| 8,893,059 B2 * | 11/2014 | Carroll ................ G06F 17/5068 716/51 |
| 2002/0109090 A1 * | 8/2002 | Nakasuji ................ B82Y 10/00 250/311 |
| 2004/0036860 A1 | 2/2004 | Hiruta |
| 2004/0090194 A1 * | 5/2004 | Gesley ................ B82Y 10/00 315/500 |
| 2007/0057200 A1 * | 3/2007 | Fujita ................ B82Y 10/00 250/492.1 |
| 2008/0067447 A1 * | 3/2008 | Nakayama ............ B82Y 15/00 250/492.22 |
| 2009/0190118 A1 | 7/2009 | Fukuhara |
| 2013/0070222 A1 * | 3/2013 | Fujimura ................ G03F 1/36 355/53 |
| 2013/0283216 A1 * | 10/2013 | Pearman ................ G06F 17/50 716/52 |

FOREIGN PATENT DOCUMENTS

| | | |
|---|---|---|
| JP | 2002-216684 | 8/2002 |
| JP | 2003-272989 | 9/2003 |
| JP | 2008-129035 | 6/2008 |
| KR | 1020090114249 A | 11/2009 |

OTHER PUBLICATIONS

Lin et al., "Model based mask process correction and verification for advanced process nodes", Mentor Graphics Corporation, Proc of SPIE, vol. 7274, Apr. 9, 2014, 10 pages.

"Calibre® MPCpro" Manufacturability Datasheet, Mentor Graphics Corporation, © 2006, 2 pages.

* cited by examiner

EXPOSURE METHODS USING E-BEAMS AND METHODS OF MANUFACTURING MASKS AND SEMICONDUCTOR DEVICES THEREFROM

REFERENCE TO PRIORITY APPLICATION

This application claims the benefit of Korean Patent Application No. 10-2014-0071485, filed Jun. 12, 2014 in the Korean Intellectual Property Office, the disclosure of which is hereby incorporated herein in its entirety by reference.

BACKGROUND

The inventive concept relates to a method of manufacturing a mask and a semiconductor device and, more particularly, to a method of manufacturing a mask and a semiconductor device by using an exposure method by e-beam.

In a semiconductor process, a lithography process using a mask may be performed for forming a pattern on a semiconductor substrate such as a wafer. The mask may be simply defined as a pattern transfer artifact in which a pattern is formed of an opaque material on a transparent base material. In brief, a mask manufacturing process, when mask data files are received from a circuit designer, a mask data preparation (MDP) is performed. The MDP may include, for example, format conversion called fracturing, augmentation of a barcode for mechanical readout, a standard mask pattern for inspection, and a job deck, and automatic and manual verification. Here, the job deck may involve generating a text file about a series of instructions such as arrangement information of multi mask files, a reference dose, and an exposure speed or method. After the MDP, a pre-process, such as front-end-of-line (FEOL), and a post-process, such as back-end-of-line (BEOL), may be performed. The pre-process may include, for example, performing an exposure process, a chemical processing process, and a measurement process for a mask. Here, the exposure process for the mask may use an e-beam or a laser. The post-process may include the inspection for defects, the repair of the defects, and coating of pellicles.

SUMMARY

The inventive concept provides an exposure method, which minimizes a time taken by mask data preparation (MDP) to optimize a total exposure process and enhances a quality of a pattern by using an inverse solution concept, based on a multi-beam mask writer. The inventive concept provides a high-speed and high-quality mask manufacturing method using the exposure method and a semiconductor device manufacturing method using a mask.

According to an aspect of the inventive concept, there is provided an exposure method using an e-beam including: receiving mask tape output (MTO) design data obtained through optical proximity correction (OPC); preparing mask data including a job deck for the MTO design data without a data format conversion; performing complex correction on the mask data, wherein the complex correction includes proximity effect correction (PEC) of an error caused by an e-beam proximity effect and mask process correction (MPC) of an error caused by an exposure process; generating pixel data, based on data for which the complex correction is performed; and performing e-beam writing on a substrate for a mask, based on the pixel data.

The exposure method may further include, before the performing of the complex correction, by a distributor, dividing the mask data into shape data and density data, wherein the performing of the complex correction includes correcting a dose of the e-beam for the density data. The correcting of the dose may include calculating a plurality of the correction dose maps for a short range, a middle range, and a long range, and merging the plurality of correction dose maps. The shape data may be converted into bitmap data through rasterization, and the pixel data may be generated by merging the bitmap data with the corrected density data. The performing of the complex correction may include performing contrast enhancement by dose modulation (CED) technology for a pattern according to a reference of a predetermined size. The CED technology may be technology that increases a dose with respect to a center of a pattern.

Technology that increases a dose of an edge of a pattern may be applied to a pattern having equal to or more than the predetermined size. The performing of the complex correction may include performing inverse mask technology (IMT) including CED technology of a model base and the complex correction. The CED technology of the model base may be performed by using an error function "E" expressed as Equation below:

$$E = \left| F(x, y) - \left[ \sum_{n=1}^{N} \{W_n \cdot G_n(x, y)\} \otimes M(x, y) \right]_{I=I_{th}} \right|$$

where $G_n(x,y)$ denotes beam data, $W_n$ denotes a weight factor for the beam data, an index "n" denotes shot information, $M(x,y)$ denotes a mask model, $F(x,y)$ denotes a target contour of a mask, and Ith denotes an intensity threshold value.

The CED technology of the model base may optimize the beam data "$G_n(x,y)$" and the weight factor "$W_n$" so that the error function "E" and a dose latitude "$D_{latitude}$" are minimized, and the dose latitude may be defined as a change amount "ΔCD/% dose" of CD based on a percentage (%) change of a dose. The e-beam writing is performed through gray writing by using a multi-beam mask writer (MBMW). The mask data may be input from one server to one exposure equipment, and the e-beam writing may be performed by performing format conversion using an exposure unit for the input mask data in real time.

According to another aspect of the inventive concept, there is provided an exposure method using an e-beam including: receiving mask tape output (MTO) design data obtained through optical proximity correction (OPC); preparing mask data including data format conversion, mask process correction (MPC), and a job deck, for the MTO design data; performing contrast enhancement by dose modulation (CED) technology for a pattern according to a reference of a predetermined size, on the mask data; performing proximity effect correction (PEC) on the mask data to which the CED technology is applied; generating pixel data, based on data for which the PEC is performed; and performing e-beam writing on a substrate for a mask, based on the pixel data.

The CED technology may be technology that increases or decreases doses by position of a pattern to enhance a dose margin of the pattern, a method that increases a dose of an edge of a pattern may be applied to a pattern having equal to or more than the predetermined size, and a method that increases a dose of a central portion or increases a dose of a whole pattern may be applied to a pattern having less than the predetermined size. The CED technology may be performed by using a model base, and the e-beam writing may be performed through gray writing by using a multi-beam mask writer (MBMW). The pixel data may be generated through rasterization for data for which the PEC is performed.

According to another aspect of the inventive concept, there is provided a method of manufacturing a mask including: receiving mask tape output (MTO) design data obtained through optical proximity correction (OPC); preparing mask data including job deck for the MTO design data without data format conversion; performing complex correction for the mask data, wherein the complex correction includes proximity effect correction (PEC) and mask process correction (MPC); generating pixel data, based on data for which the complex correction is performed; performing e-beam writing on a substrate for a mask, based on the pixel data; and performing a development process and an etching process for the substrate for the mask to form a mask including a target pattern.

The method may further include, before the performing of the complex correction, by a distributor, dividing the mask data into shape data and density data, wherein, the performing of the complex correction includes correcting a dose of the e-beam for the density data to generate a correction dose map, and the generating of the correction dose map includes generating a plurality of correction dose maps by predetermined distance range, and merging the plurality of correction dose maps to generate the correction dose map.

In the performing of the complex correction, CED technology that increases a dose of a center of a pattern may be applied to a pattern having less than a predetermined size, and CED technology that increases a dose of an edge of the pattern may be applied to a pattern having equal to or more than the predetermined size. The performing of the complex correction may include performing CED technology of a model base. The mask data may be input from one server to one exposure equipment, the e-beam writing may be performed by performing format conversion by exposure unit for the input mask data in real time, and the e-beam writing may be performed through gray writing by using a multi-beam mask writer (MBMW).

According to another aspect of the inventive concept, there is provided a method of manufacturing a mask including: receiving mask tape output (MTO) design data obtained through optical proximity correction (OPC); preparing mask data including data format conversion, mask process correction (MPC), and job deck, for the MTO design data; performing contrast enhancement by dose modulation (CED) technology for a pattern according to a reference of a predetermined size, for the mask data; performing proximity effect correction (PEC) for the mask data to which the CED technology is applied; generating pixel data, based on data for which the PEC is performed; performing e-beam writing on a substrate for a mask, based on the pixel data; and performing a development process and an etching process for the substrate for the mask to form a mask including a target pattern.

According to another aspect of the inventive concept, there is provided a method of manufacturing a semiconductor device including: receiving mask tape output (MTQ) design data obtained through optical proximity correction (OPC); preparing mask data including a job deck for the MTO design data without data format conversion; performing complex correction for the mask data, wherein the complex correction includes proximity effect correction (PEC) and mask process correction (MPC); generating pixel data, based on data for which the complex correction is performed; performing e-beam writing on a substrate for a mask, based on the pixel data; performing a development process and an etching process on the substrate for the mask to form a mask including a target pattern; and forming a semiconductor device through a lithography process using the mask.

According to another aspect of the inventive concept, there is provided a method of manufacturing a semiconductor device including: receiving mask tape output (MTO) design data obtained through optical proximity correction (OPC); preparing mask data including data format conversion, mask process correction (MPC), and job deck, for the MTO design data; performing contrast enhancement by dose modulation (CED) technology for a pattern according to a reference of a predetermined size, for the mask data; performing proximity effect correction (PEC) for the mask data to which the CED technology is applied; generating pixel data, based on data for which the PEC is performed; performing e-beam writing on a substrate for a mask, based on the pixel data; performing a development process and an etching process for the substrate for the mask to form a mask including a target pattern; and forming a semiconductor device through a lithography process using the mask.

BRIEF DESCRIPTION OF THE DRAWINGS

Exemplary embodiments of the inventive concept will be more clearly understood from the following detailed description taken by conjunction with the accompanying drawings in which.

DETAILED DESCRIPTION OF THE EMBODIMENTS

Figure 1:
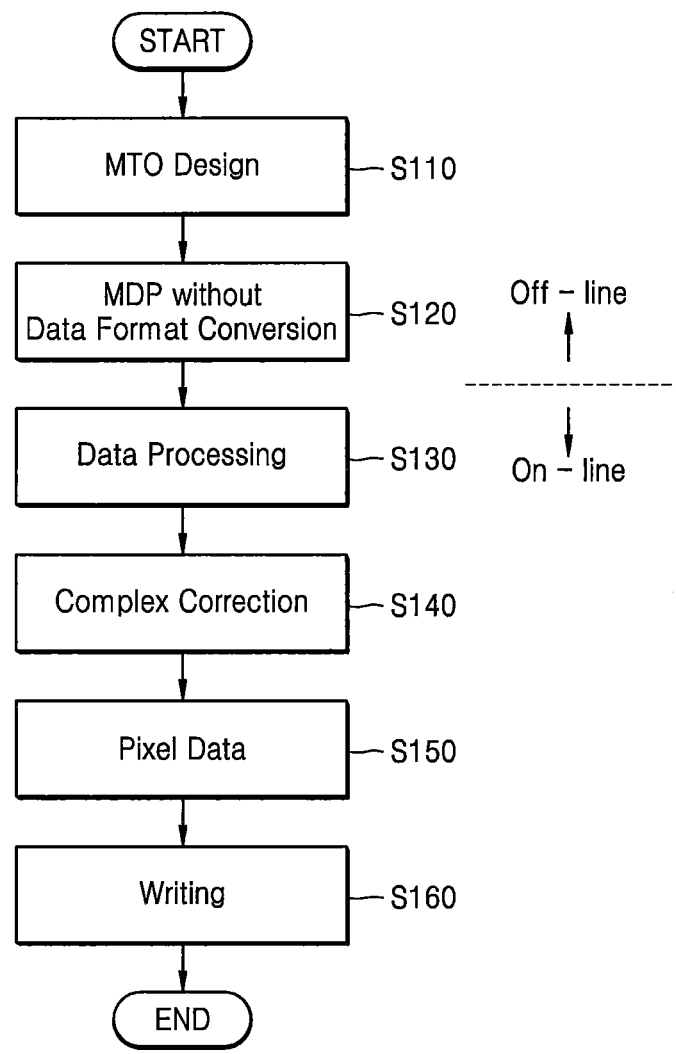
FIG. 1 is a flowchart of an exposure method using an e-beam, according to an embodiment of the inventive concept.

Hereinafter, embodiments of the inventive concept will be described in detail with reference to the accompanying drawings. Embodiments of the inventive concept are provided for fully conveying the concept of the inventive concept to those skilled in the art. The inventive concept may be embodied in many different forms and should not be construed as being limited to the embodiments set forth herein; rather, these embodiments are provided so that this disclosure will be thorough and complete, and will fully convey the concept of the inventive concept to those skilled in the art.

In this disclosure below, when an element is described as being connected to another element, the element may be directly connected to the other element, but a third element may be disposed therebetween. When an element is referred to as being 'on' another element, it may be directly on the other element, or intervening elements may also be present. Structures or sizes of elements illustrated in the accompanying drawings and an interval between the elements may be exaggerated for clarity of the specification, and a portion irrelevant to description is omitted. Like reference numerals refer to like elements throughout. Terms used herein are described for the purpose of describing the inventive concept, and are not described for limiting a meaning or limiting the spirit and scope of the inventive concept defined by claims.

FIG. 1 is a flowchart of an exposure method using an e-beam, according to an embodiment of the inventive concept. Referring to FIG. 1, in operation S110, mask tape output (MTO) design data obtained through optical proximity correction (OPC) is first received. Generally, an MTO may include requesting the manufacturing of a mask by transferring mask design data in which an OPC stage is completed. Therefore, the MTO design data may be the mask design data in which the OPC operation is completed. The MTO design data may have a graphic data format used in electronic design automation (EDA) software. For example, the MTO design data may have a data format such as graphic data system II (GDS2) or open artwork system interchange standard (OASIS).

Regarding the OPC stage, in brief, an optical proximity effect (OPE) caused by an influence between adjacent patterns occurs in an exposure operation because a pattern is micronized. The OPC stage denotes a method that corrects a pattern layout of a mask (or which transfers a pattern) for overcoming the OPE, to prevent the OPE from occurring. Such OPC technology is largely divided into two technologies: one being rule-based OPC and the other being a simulation base or model-based OPC.

The rule-based OPC technology manufactures a mask pattern for test, and transfers the mast pattern for test to a wafer to manufacture a wafer for test. Subsequently, the rule-based OPC technology determines a design rule (i.e., a design rule for determining bias data applied to design data of a mask pattern), based on measurement data about a pattern formed on the wafer and design data of a mask for test. When such a design rule is determined, the mask pattern is corrected based on the design rule. Correction is performed in a layout CAD stage for the mask pattern. The rule-based OPC technology measures a test pattern for all patterns which are allowed in design and repeats an operation each time a process is changed. For this reason, much cost and much time are consumed.

The model-ruled OPC technology generates kernels representing a transfer process in consideration of the OPE, based on a measurement result of a small number of ready test patterns (i.e., a representative pattern), simulates and obtains a difference between a shape of a mask pattern and a shape of a pattern transferred to a wafer by using a process model including the kernels, and corrects the mask pattern depending on a simulation result. The rule-based OPC technology needs not calculate the number of test patterns, and thus decreases time and cost. However, it is difficult to sufficiently reflect the influences of a density of patterns and a shape or a distance of an adjacent pattern.

In operation S120, MDP is performed without a data format conversion after the MTO design data is received. The MDP in related art, as described above, includes stages such as conversion of a data format, augmentation, and inspection. However, in the exposure method according to an embodiment of the inventive concept, the MDP does not perform format conversion. Also, an inspection stage may be omitted. Therefore, the MDP may include only a basic operation such as a job deck. Here, the job deck may mean generating a text file about a series of instructions such as arrangement information of multi mask files, a reference dose, and an exposure speed or method. Also, the MDP may include augmentation of a barcode for mechanical readout, an identifiable label, an aim mark, and a standard mask pattern for inspection. The MDP may be generally performed off-line.

In the MDP stage, format conversion (i.e., fracturing) may denote a process that divides MTO design data by regions, and changes the divided MTO design data into a format for an e-beam writer. In the fracturing, data manipulation such as scaling, sizing of data, rotating of data, pattern reflection, and color conversion may be performed.

In a conversion operation using fracturing, data for a number of systematic errors which occur in an operation of transferring design data to an image on a wafer may be corrected. A data correction process for the systematic errors is referred to as mask process correction (MPC) and, for example, may include line width adjustment, referred to as threshold dimension (CD) adjustment, and an operation of increasing a degree of precision of a pattern arrangement. Therefore, fracturing contributes to enhancing a quality of a final mask and may be a process that is preferentially performed for MPC. Here, the systematic errors are caused by distortion which occurs in an exposure process, a mask development process, an etching process, and a wafer imaging process.

Since the fracturing or the MPC is an operation which is performed off-line, takes an excessive data manipulation time, and typically causes an increase in the amount of data, the fracturing or the MPC delays an exposure process, and is an obstacle to enhancing a productivity of a mask. For example, the fracturing or the MPC may be an operation which takes one or two days. Recently, since a pattern is micronized, more time is taken by the fracturing or the MPC, and for this reason, the fracturing or the MPC acts as an obstacle to a productivity of a mask.

However, the exposure process according to the present embodiment does not perform format conversion (i.e., fracturing), and thus, an MDP stage may be completed within several hours or one hour. Also, the exposure process according to the present embodiment performs only a basic job deck without a format conversion, and thus, mask data after the MDP is completed may maintain the same format as a format of the MTO design data.

In operation S130, data processing may be performed on the mask data on which the MDP was completely performed. The data processing is a preprocessing operation for the mask data, and may include grammar check and exposure time prediction for the mask data. As illustrated by an arrow, a data processing stage (S130) and stages subsequent thereto may be performed on-line in exposure equipment. That is, the mask data may be input to the exposure equipment, and data processing may be performed on-line. As described above, since the MDP-completed mask data maintains the same format as a format of the MTO design data, the mask data input to the exposure equipment may also maintain the same format as a format of the MTO design data.

After the data processing, complex correction is performed in operation S140. The complex correction may mean a complex correction process of proximity effect correction (PEC), which is a process of correcting an error caused by an e-beam proximity effect (i.e., scattering of an e-beam), and MPC that is a process of correcting an error which occurs in an exposure process.

In brief, in an e-beam exposure process, a high acceleration voltage (used to generate an e-beam) is applied to electrons, and a resist and atoms of a material disposed thereunder are scattered together with the electrons. The scattering is generally referred to as the e-beam proximity effect. The e-beam proximity effect may be modeled by using two Gaussian functions or modeled by using a proximity function which is empirically determined, and the e-beam proximity effect may be corrected based on the functions.

PEC, which is most generally used to correct an error caused by the e-beam proximity effect, is a method that changes a dose in an actual exposure to compensate for the dose changed by scattering. For example, a relatively low dose may be allocated to a region having a high pattern density, and a relatively high dose may be allocated to small shapes which are relatively isolated. Here, the dose may denote an irradiation amount of an e-beam. The PEC may include a method that corrects a corner of a pattern shape, or changes a size of the pattern shape.

The PEC may be generally performed over a middle range to a long range and may be performed on-line in the exposure equipment. For reference, a short range, the middle range, and the long range are concepts in which a range that is able to be affected by the e-beam proximity effect or the exposure process is divided by distance, and the range may be variously classified by a worker. For example, a range of about 100 nm to about 1 μm may be classified as the short range, a range of about 1 μm to about 5 μm may be classified as the middle range, and a range of about 5 μm to about 30 μm may be classified as the long range. As another example, a range of about 10 nm to about 500 nm may be classified as the short range, a range of about 500 nm to about 20 μm may be classified as the middle range, and a range of about 20 μm to about 10 mm may be classified as the long range.

The MPC, as described above, is a process that corrects an error which occurs in an actual exposure process, which may be a concept which includes e-beam writing, development, etching, and baking. The MPC may be performed in the MDP stage along with fracturing and may be performed in a correction method for mask data, instead of a correction method for a dose. Also, the MPC may be generally performed over the short range and the middle range. The MPC may complement the PEC. For example, when a peripheral pattern density is high, a CD error occurs despite the PEC, and the CD error may be corrected through the MPC.

In the related art, when a pattern density is low or a pattern size is large, the MPC may be omitted. However, recently, a pattern size is fine and a pattern density is densified. Therefore, the MPC is a necessary process, and as described above, is a process that takes too long, along with fracturing.

An effect based on the actual exposure process may be modeled by using a Gaussian function, and thus, the MPC may also be performed in a correction method using a dose, based on the Gaussian function. Therefore, in a complex correction stage according to the present embodiment, both the PEC and the MPC may be complexly performed. Also, considering that the PEC and the MPC use a dose correction method, complex correction may be regarded as a concept in which dose corrections respectively corresponding to the short range, the middle range, and the long range may be complexly performed.

As described above, the exposure method according to the present embodiment performs the complex correction (i.e., the MPC and the PEC) on-line in the exposure equipment, and thus considerably shortens a process time, compared to the MDP stage that performs the MPC off-line. Here, the complex correction being performed on-line in the exposure equipment may mean that the complex correction is automatically performed in the exposure equipment by using software for performing the complex correction.

In regard to the complex correction, a method will be described in detail with reference to FIG. 2. In operation S150, pixel data for data for which the complex correction is performed is generated and stored in a storage unit (not shown). The pixel data is data which is directly used in an actual exposure, and may include data about a shape, which is an exposure target, and data about an allocated dose. Here, the data about the shape may be bitmap data obtained by converting shape data (vector data) through rasterization.

After the pixel data is stored, the e-beam exposure process (i.e., an e-beam writing process) is performed by using the stored pixel data in operation S160. Here, the e-beam writing process may be performed in a gray writing method using a multi-beam mask writer (MBMW). A gray writing process using the MBMW will be described in detail with reference to FIG. 5.

As described above, the exposure method using an e-beam, according to the present embodiment, performs only a basic operation such as a job deck without a file format conversion or the MPC in the MDP stage, and complexly performs the PEC and the MPC on-line in the exposure equipment by using the dose correction method, thereby considerably decreasing a time taken by the exposure process. Therefore, a production problem of a mask which occurs due to an excessive time taken by the MDP stage is solved.

Figure 2:
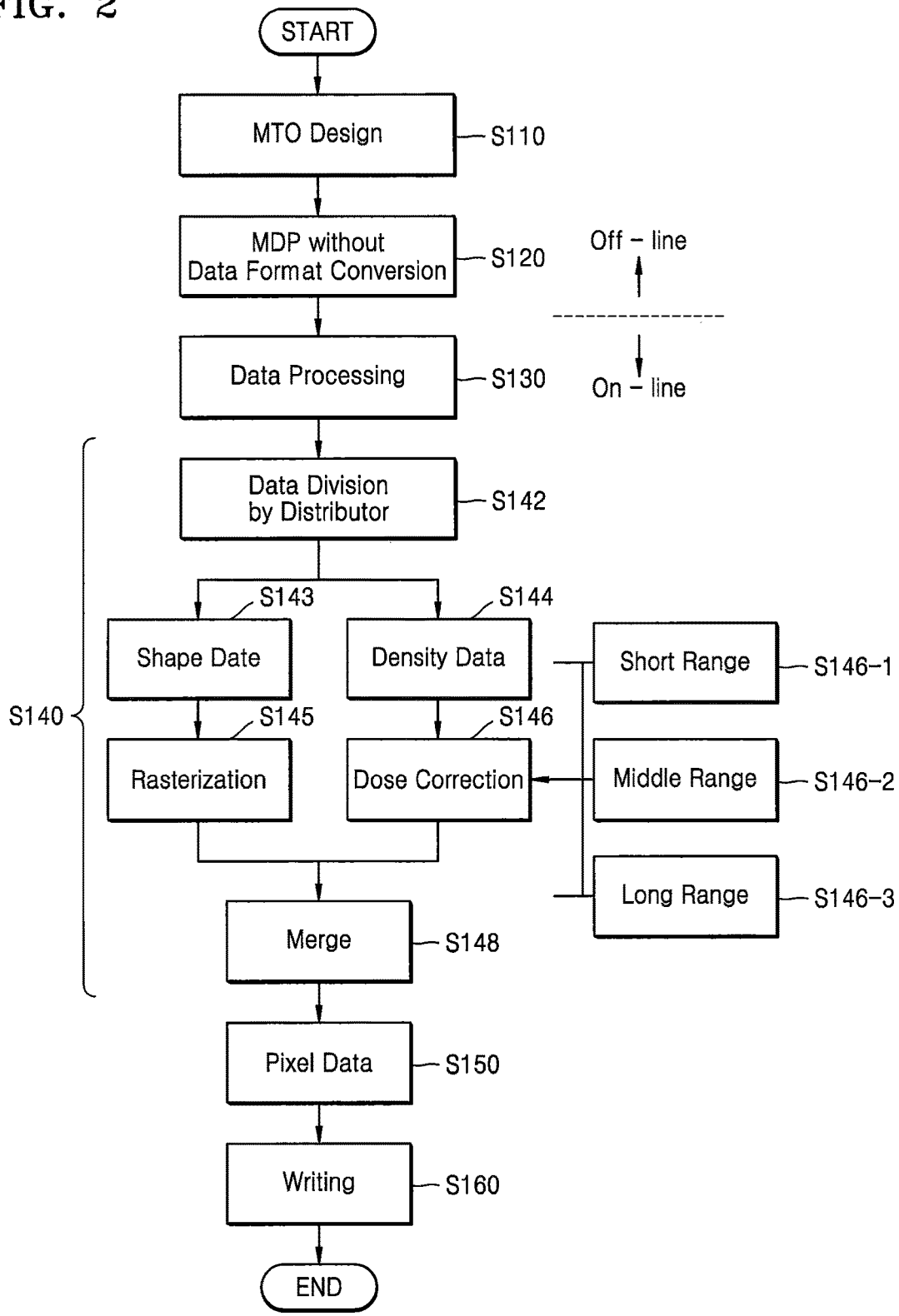
FIG. 2 is a flowchart of a complex correction stage of FIG. 1 in detail.

FIG. 2 is a flowchart of a complex correction stage of FIG. 1 in detail. For convenience of description, descriptions provided above with reference to FIG. 1 are not repeatedly provided. Referring to FIG. 2, as described above with reference to FIG. 1, the MTO design data may be input in operation S110, the MDP may be performed without a data format conversion in operation S120, and the data processing may be performed in the exposure equipment in operation S130. Subsequently, complex correction may be performed in operation S140. A complex correction stage (S140) may be divided into a plurality of stages. For example, the complex correction stage (S140) may include a data division stage (S142), performed by a distributor, to a stage (S148) that merges the bitmap data with a total correction dose map.

In detail, in operation S142, the distributor divides the mask data, on which the data processing is performed, into shape data and density data. Here, the shape data may be vector data, and the density data may be data about a dose allocated to each pixel. After the data division, the shape data is input to a format conversion unit (220 in FIG. 17) in operation S143, and the density data is input to a correction unit (230 in FIG. 17) in operation S144.

In operation S145, the format conversion unit converts the shape data, which is the vector data, into the bitmap data through rasterization. The rasterization is an operation of converting the vector data or contour data into the bitmap data, and in detail, is an operation of converting the vector data into a data structure which describes a position of a corresponding pixel in a scanning order, namely, from top to bottom and from a left side to a right side, or which describes a position or a size of a bitmap image (a dot shape) of a figure or a letter.

In operation S146, the correction unit performs dose correction on the density data. Here, the dose correction may include the PEC and the MPC. For example, the dose correction may respectively calculate correction dose maps for the short range, the middle range, and the long range in operations S146-1, S146-2 and S146-3, and may merge the correction dose maps to generate a total correction dose map. Here, as described above, the dose corrections for the middle range and the long range may correspond to the PEC, and the dose corrections for the short range and the middle range may correspond to the MPC.

After the conversion into the bitmap data and the dose correction, the bitmap data is merged with the total correction dose map in operation S148. The concept of merging the bitmap data with the total correction dose map is a concept of allocating a dose to each portion of the bitmap data, and may be considered as an operation of coating the dose on each pixel. As described above, pixel data may be generated by merging the bitmap data with the total correction dose map.

As described above, in operation S150, the pixel data is stored in the storage unit (not shown) for the exposure process, namely, the e-beam writing process. In operation S160, the e-beam exposure process (i.e., the e-beam writing process) is performed in the exposure equipment by using the stored pixel data.

Figure 3:
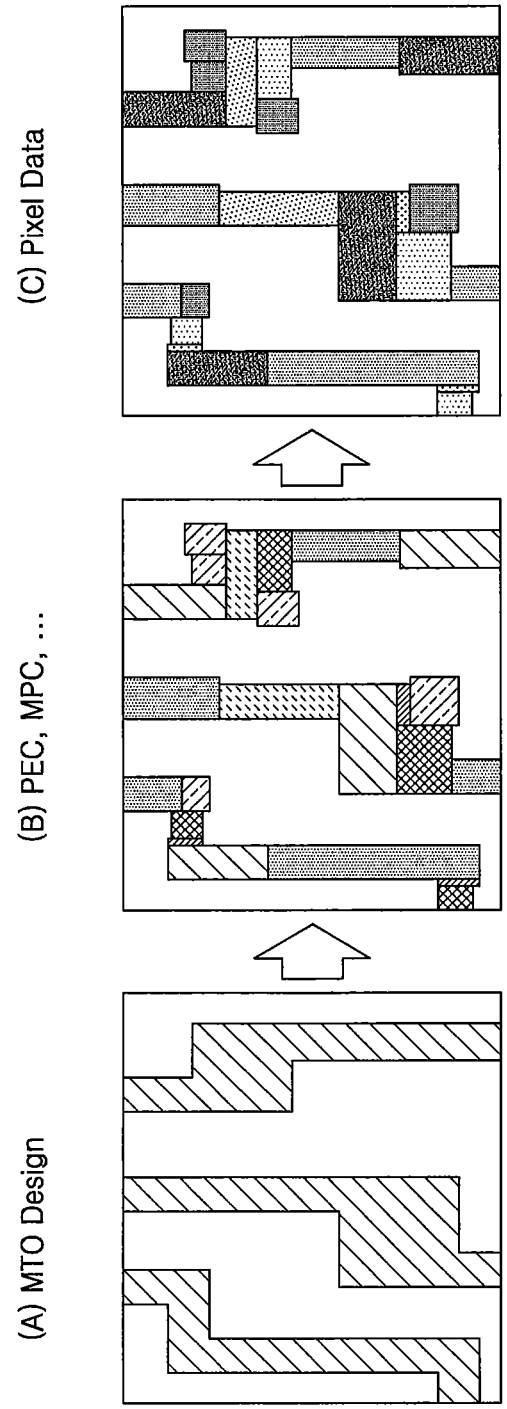
FIG. 3 is a conceptual view schematically illustrating the exposure method using the e-beam of FIG. 1 by using a corresponding mask pattern shape.

FIG. 3 is a conceptual view schematically illustrating the exposure method using the e-beam of FIG. 1 by using a corresponding mask pattern shape. Referring to FIG. 3, FIG. 3 (A) illustrates MTO design data, obtained through OPC, in a pattern shape. The MTO design data, for example, may have two-dimensional (2D) data values based on an OASIS file format. Subsequently, simple MDP, including the job deck, may be performed on the MTO design data, and mask data having the same format as that of the MTO design data may be input to the exposure equipment. An operation such as a job deck does not convert data, and thus, the drawing of a corresponding pattern shape is omitted.

In FIG. 3 (B), the PEC and the MPC are performed for mask data. Therefore, corresponding pattern shapes are illustrated. It may be seen that the PEC and the MPC fundamentally perform dose correction, and thus, hatching is differently shown. The PEC and the MPC may include pattern size correction or shape correction, in addition to the dose correction. Therefore, it may be seen that the whole shape of a pattern in FIG. 3 (B) slightly differs from a shape of a pattern in FIG. 3 (A). Correction mask data in FIG. 3 (B) may include basic design data, data about an increase/reduction in a size, and data about a dose.

FIG. 3 (C) illustrates, in a pattern shape, pixel data which is generated by merging bitmap data, obtained by converting shape data through rasterization, and a correction dose map which is generated through dose correction. The pixel data is data in which a dose is fundamentally allocated to the bitmap data, and thus, a shape of a pattern in FIG. 3 (C) may be shown as a form in which a dose is coated on each pixel. In order to distinguish the shape of the pattern in FIG. 3 (C) from the shape of the pattern in FIG. 3 (B), the shape of the pattern in FIG. 3 (C) is shown as a rare or dense form of dots, and a portion having no pattern is shown blank.

Figure 4:
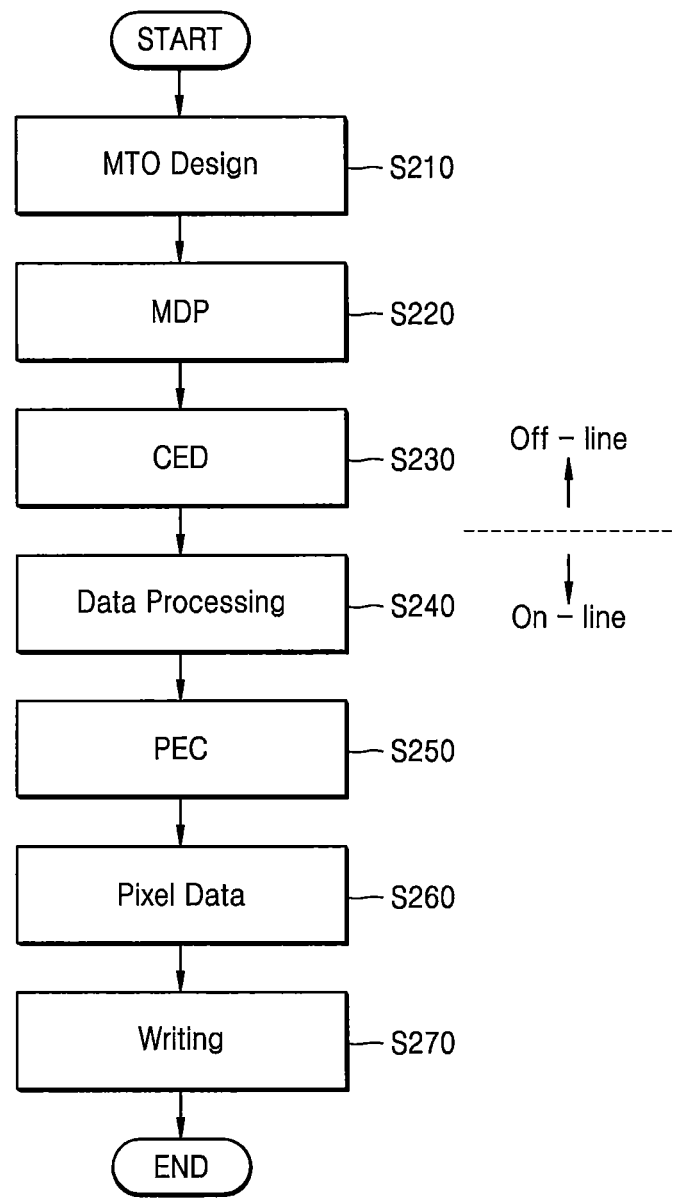
FIG. 4 is a flowchart of an exposure method using an e-beam, according to an embodiment of the inventive concept.

FIG. 4 is a flowchart of an exposure method using an e-beam, according to an embodiment of the inventive concept. Referring to FIG. 4, in operation S210, MTO design data is first received. Operation S210 is the same as operation S110 of receiving the MTO design data in FIG. 1, and thus, its detailed description is not provided. Subsequently, MDP is performed in operation S220. In the present embodiment, the MDP may include format conversion (i.e., fracturing and data process correction) as well as a job deck. After the MDP is completed, contrast enhancement by dose modulation (CED) technology is applied. The CED technology may mean an operation that optimizes doses by position so as to enhance a dose margin. That is, the CED technology may be technology that increases or decreases doses by position of a pattern so as to enhance a dose margin of a pattern. As an example of a method of applying the CED technology, CED technology that increases a dose with respect to the center of a pattern or increases a dose of a whole pattern is applied to a pattern having a size that is less than a predetermined size, and CED technology that increases a dose of an edge of a pattern is applied to a pattern having a size that is equal to or more than a predetermined size.

In the related art, dose correction is a method that increases a dose of an edge, and is performed for a pattern having a large size, for example, a pattern of equal to or more than 100 nm. However, when a dose of an edge increases in a pattern of less than 100 nm, a quality of the pattern is degraded. Therefore, in the exposure method according to the present embodiment, the CED technology is applied to perform dose correction of a pattern with respect to a predetermined size (for example, about 100 nm), thereby enhancing a quality of the pattern. The CED technology will be described in detail with reference to FIGS. 5 to 8.

Similarly to the related art, technology for increasing a dose of an edge may be applied to a pattern having a predetermined size, for example, 100 nm or more. Dose correction for a pattern of 100 nm or more, for example, may be performed in the MDP stage (S220) or a PEC stage (S250).

In operation S240, data processing is performed on mask data for which the CED technology is performed. The data processing is performed in the exposure equipment and may be almost the same as the data processing stage (S130) of FIG. 1. A subsequent process may be almost similar to an e-beam exposure process.

For example, PEC is performed in operation S250, pixel data is generated in operation S260, and an e-beam writing process is performed by using the generated pixel data in operation S270. In the embodiment of FIG. 1, the PEC and the MPC are complexly performed, but in the present embodiment, the PEC may be performed irrespective of the MPC. Although not shown, a data conversion stage such as rasterization may be performed before the pixel data is generated.

In the exposure method using the e-beam according to the present embodiment, a dose correction method is differently applied to each size of a pattern, thereby enhancing a pattern quality of a mask. In detail, CED technology that increases a dose of a central portion or increases a dose of a whole pattern may be applied to a predetermined size (for example, a size of less than 100 nm), and CED technology that increases a dose of an edge may be applied to a size of equal to or more than 100 nm, thereby enhancing a pattern quality of a mask. The exposure method using the e-beam, according to the present embodiment, may be applied to a high-specification mask or semiconductor device which very importantly requires a quality of a pattern.

Figure 5:
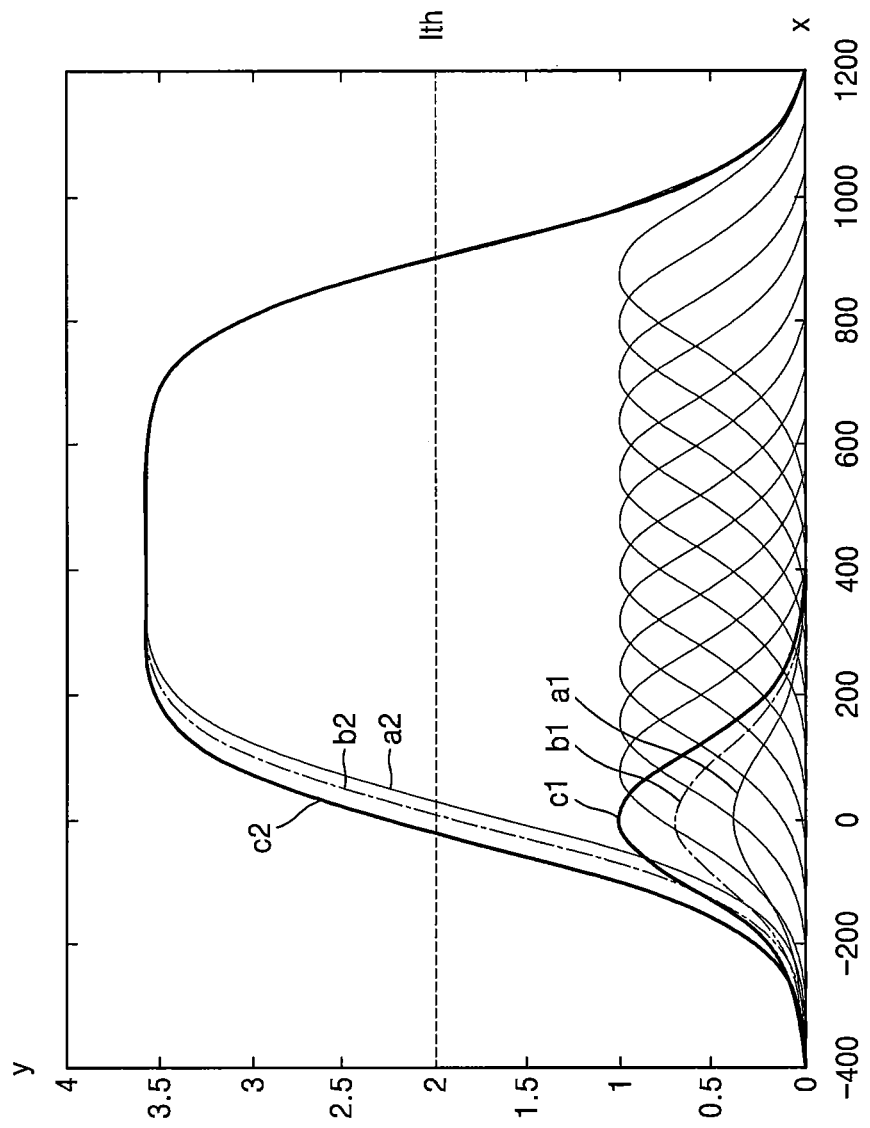
FIG. 5 is a graph showing a concept of gray exposure applied to an exposure method using an e-beam, according to an embodiment of the inventive concept.

FIG. 5 is a graph showing a concept of gray exposure applied to an exposure method using an e-beam, according to an embodiment of the inventive concept. In FIG. 5, the X axis indicates a coordinate position, and the Y axis indicates a relative value as an intensity of an e-beam.

Referring to FIG. 5, the exposure method using the e-beam may be generally divided into a variable shape beam (VSB) exposure method and a gray writing method using the MBMW. In detail, the exposure method using the e-beam may be divided into various exposure methods such as a raster scan exposure method, a vector scan exposure method, a raster shape exposure method, a cell-projection exposure method, a micro column exposure method, an arbitrary shape beam exposure method, a raster multi-beam exposure method, a multi-column lithography exposure method, a distributed variable shape beam exposure method, and a multi-column multi-beam exposure method.

The VSB exposure method is an exposure method that generates a beam having a shape having a larger size than that of a Gaussian spot and exposes a whole mask or an important portion of a shape at one time. The VSB exposure method fundamentally passes a beam, emitted from a light source, through two openings and deflects the beam between the two openings, thereby adjusting a shape and a size of the beam. However, in the VSB exposure method, a Manhattan-shaped pattern is relatively easy to write, but since it is required to disassemble a diagonal shape into a tetragonal shape, productivity is considerably reduced.

Since the gray writing method using the MBMW is a method using an overlap of a plurality of beams instead of a single beam, a dose for each beam is adjusted, and thus, it is easy to adjust a shape or a size of a whole pattern. For example, the gray writing method using the MBMW may individually adjust, through blanking deflection of a blanking plate, doses of beams passing through an aperture member by using the aperture member, in which a plurality of holes arranged at certain pitches are formed, and the blanking plate which is disposed under the aperture member and in which a plurality of holes are arranged. In the gray writing method using the MBMW, a plurality of e-beams are implemented in a matrix type, for example, a structure such as 512*512, and thus, high-speed mask exposure is performed.

The shown graph shows that intensities of all beams are adjusted by adjusting an intensity of each beam. In detail, as in a thin solid line a1, relatively low intensity is allocated to a leftmost individual beam, and thus, as in a thin solid line a2, a width of the intensities of all the beams is relatively narrow. Also, as in a thick solid line c1, relatively high intensity is allocated to a leftmost individual beam, and thus, as in a thick solid line c2, the width of the intensities of all the beams is broad.

Here, a dashed line illustrated over a 2 portion of the Y axis indicates an intensity threshold value Ith and denotes a minimum value of intensity which is effectively applied to pattern formation in an actual exposure process. That is, a beam having intensity that is equal to or less than the intensity cannot contribute to form a pattern in the exposure process. Therefore, a width of intensity corresponding to the intensity threshold value Ith corresponds to a size of a pattern. As a result, the gray writing method using the MBMW adjusts an intensity of an individual beam to adjust a width of intensities of all beams, namely, a size of a pattern.

Although not shown, shapes of intensities of all beams may be adjusted by adjusting an individual intensity of a central portion. As described above, shapes of intensities of all beams are adjusted by adjusting individual intensity, thereby enhancing a quality of a pattern. This will be described in detail with reference to FIGS. 6 to 8.

Figure 6:
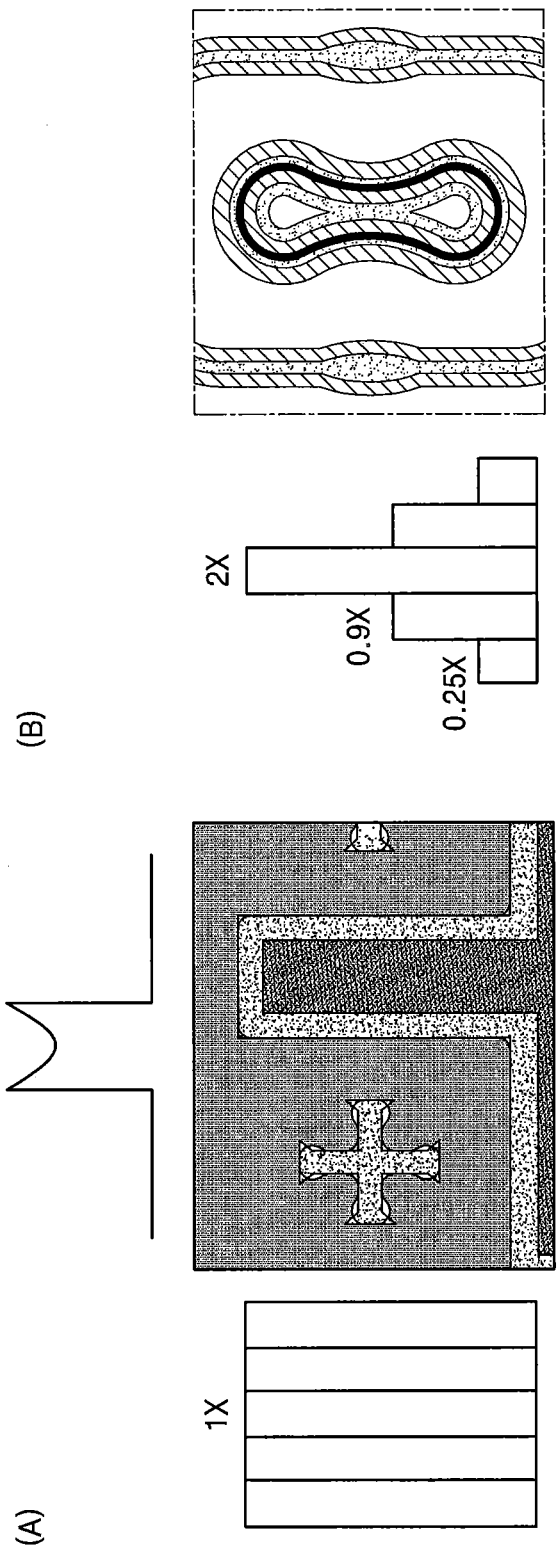
FIG. 6 is a pattern diagram for schematically describing a concept of CED technology applied to an exposure method using an e-beam, according to an embodiment of the inventive concept.

FIG. 6 is a pattern diagram for schematically describing a concept of CED technology applied to an exposure method using an e-beam, according to an embodiment of the inventive concept. Referring to FIG. 6, FIG. 6 (A) illustrates that the related art exposure method adjusts a dose of a pattern to enhance a quality of the pattern, and the same dose is allocated to a small-size pattern, for example, a whole left cross-shaped pattern. A concept of allocating the same dose is illustrated as bars having the same size of 1× on the left.

In a pattern having a relatively large size, for example, a large pattern which is disposed over the left and the right of the cross-shaped pattern, a dose of an edge increases by adjusting the dose. In other words, the dose of the edge is relatively higher allocated than a central portion, thereby enhancing a quality of a pattern. A concept of increasing the dose of the edge is illustrated at an upper portion in a shape where both sides are sharply high, and a central portion is low.

The method of increasing the dose of the edge may be performed by using a model base, or may be performed by using a rule base. A method of relatively further increasing a dose than another portion may use, for example, a double shot patterning method that repeatedly irradiates a beam onto the same place. The present embodiment is not limited to the double shot patterning method, and a dose of a certain portion may relatively increase by using other various methods.

FIG. 6 (B) illustrates a method of enhancing a quality of a pattern by using CED technology applied to the exposure method according to the present embodiment. For example, the CED technology is a concept of relatively increasing a dose of a central portion for a fine-size pattern, for example, a pattern of less than 100 nm. As illustrated, when a width of a pattern is very small, a high dose is allocated to a central portion and a low dose is allocated to an edge, thereby enhancing a quality of a pattern. A concept of increasing the dose of the central portion is illustrated, on the left, as bars in which the center is high as 2× and both sides are low as 0.25×. Furthermore, the CED technology may increase or decrease doses by position of a pattern by using various methods such as a method that increases a dose of a central portion or a method that increases all doses of a pattern for a pattern having a size that is less than a predetermined size, and a method that increases a dose of an edge for a pattern having a size that is equal to or more than a predetermined size.

The CED technology may be performed by using the rule base, or may be performed by using the model base. A model-based CED (M-CED) technology may be included as inverse mask technology (IMT) to be described below. The IMT may be defined as a concept of merging PEC, MPC, and M-CED, which use the model base. Depending on the case, the IMT may be defined by using only the M-CED technology.

In the exposure method according to the present embodiment, since the CED technology is applied, a dose is adjusted for fine patterns by using the CED technology, and then, error calculation and error correction may be performed by using the model base. Also, MDP is performed before the CED technology is applied. Here, the MDP may include only a job deck as in FIG. 1, or as in FIG. 4, may include various processes such as format conversion, MPC, and a job deck.

Figure 7:
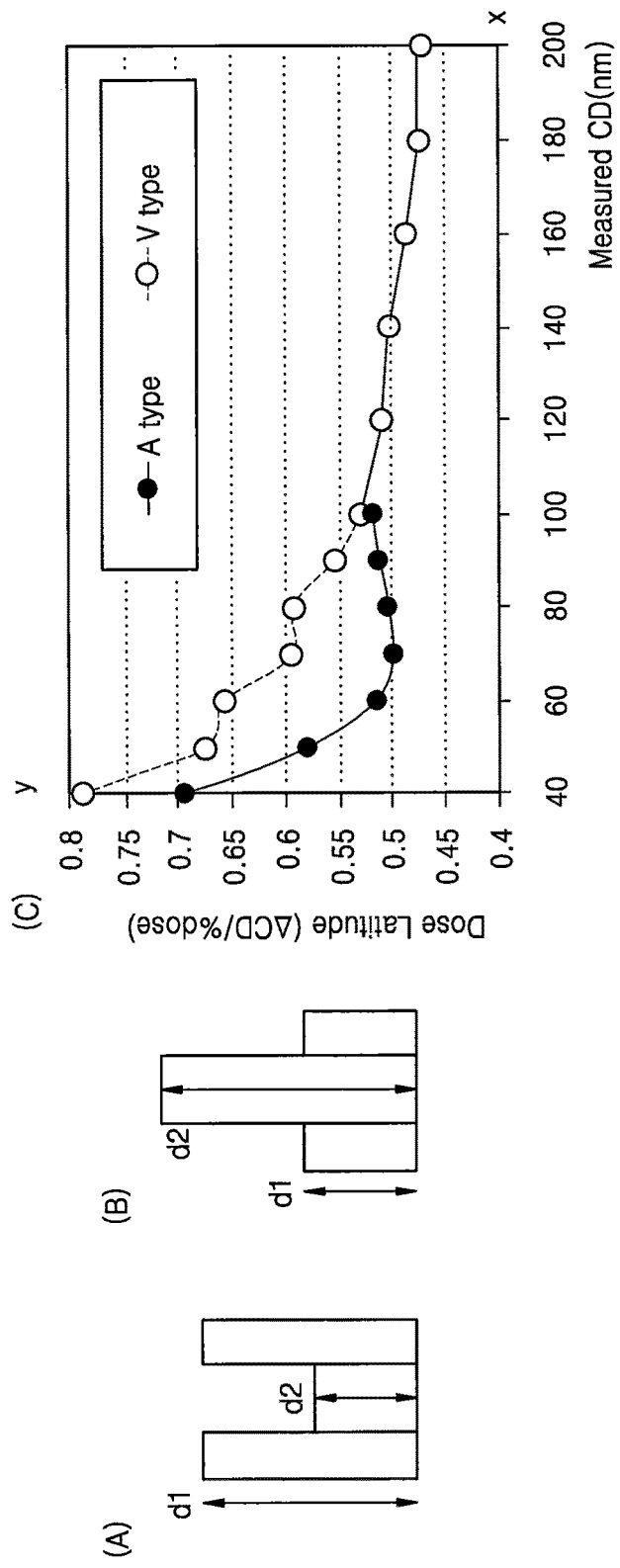
FIG. 7 illustrates simulation evaluation graphs of the CED technology of FIG. 6.

FIG. 7 is simulation evaluation graphs of the CED technology of FIG. 6. In the graph of FIG. 7 (C), the X axis indicates CD in units of nm, the Y axis indicates a dose latitude in units of ΔCD/% dose. FIG. 7 (A) is a bar graph that shows V-shaped dose adjustment, and FIG. 7 (B) is a bar graph that shows A-shaped dose adjustment. Here, d1 and d2 may respectively denote heights of the bar graphs, namely, dose sizes.

Referring to the graph of FIG. 7 (C), in the A-shaped dose adjustment, it may be seen that the dose latitude is low at a portion in which a CD size is 100 nm to 60 nm. In the V-shaped dose adjustment, it may be seen that the dose latitude decreases as the CD size becomes greater than 100 nm. The dose latitude is defined as a CD change caused by a percentage (%) change of a dose as shown in a unit, and as the dose latitude decreases, the dose latitude has smaller-the-better quality of characteristic. Although not shown in the graph, in the A-shaped dose adjustment, the dose latitude increases as the CD size becomes greater than 100 nm.

As a result, the simulation evaluation graph of FIG. 7 (C) shows that a quality of a pattern is enhanced by performing the A-shaped dose adjustment for a pattern having a size of less than 100 nm, namely, by relatively increasing a dose of a central portion. Also, the quality of the pattern is enhanced by performing the V-shaped dose adjustment for a pattern having a size of equal to or more than 100 nm. So far, the A-shaped dose adjustment and the V-shaped dose adjustment have been described, but the present embodiment is not limited thereto. For example, an M-shaped or flat-shaped dose adjustment may be applied for enhancing the quality of the pattern.

Figure 8:
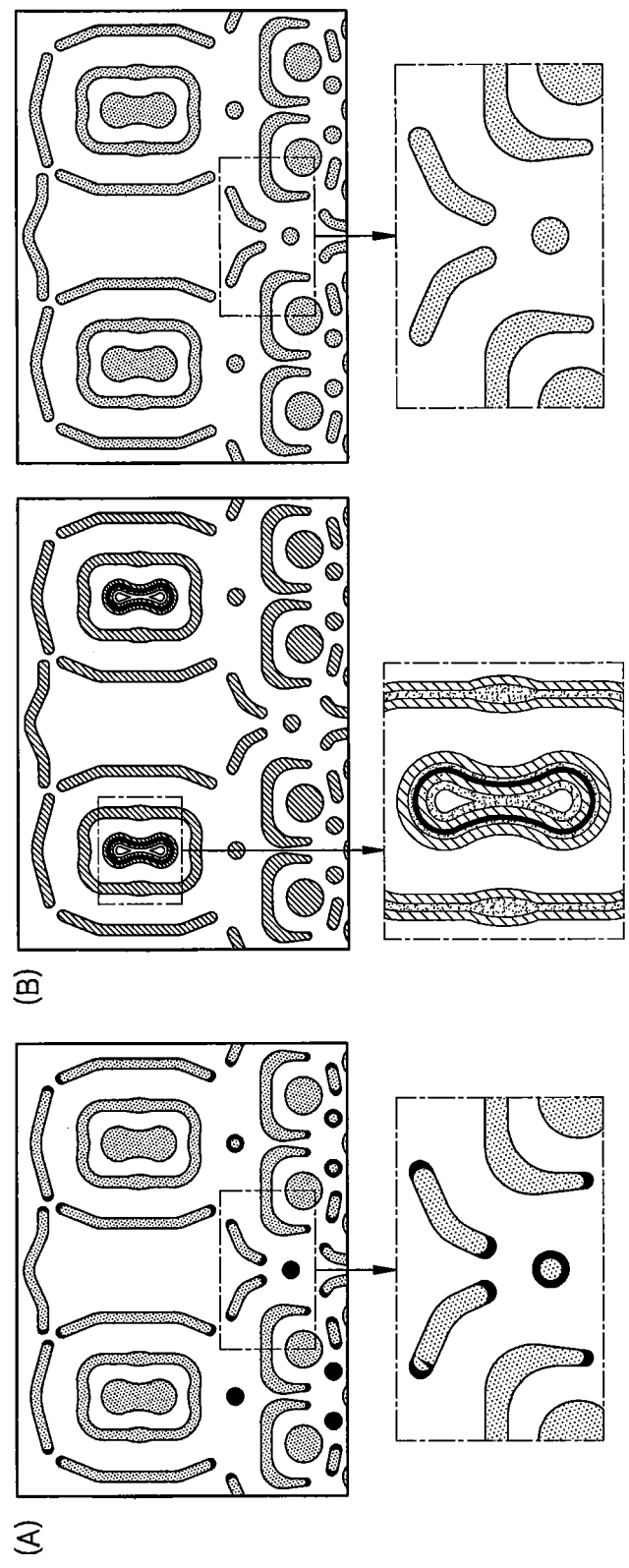
FIG. 8 illustrates pattern diagrams for describing the effects of the CED technology of FIG. 6.

FIG. 8 is pattern diagrams for describing the effects of the CED technology of FIG. 6. FIG. 8 (A) shows a pattern of a mask on which e-beam writing is performed by applying a related art method, for example, the flat-shaped or V-shaped dose adjustment. As illustrated, a line end is shortened, line edge roughness (LER) increases, and a minimum resolution is not good. Here, portions, which are illustrated in black at an end of a pattern, are shortened, and as the size of shortened portions increases, a dose margin is reduced. That is, an accurate dose is needed so that a shortened portion does not appear.

FIG. 8 (B) shows a pattern of a mask on which e-beam writing is performed by applying the CED technology according to the present embodiment. In FIG. 8 (B), a left side shows a dose map for the A-shaped dose adjustment and a right side shows a pattern of a mask which is obtained through the A-shaped dose adjustment.

As shown, it may be seen that the shortening of a line end is considerably reduced. That is, it may be seen that a black portion hardly appears at an end portion of a pattern. For example, in the related art method, a line end is shortened by about 10 nm, but by applying the CED technology according to the present embodiment, a line end is shortened by about 3 nm. That is, according to the present embodiment, the shortening of the line end is considerably reduced. Also, it may be seen that by performing the A-shaped dose adjustment based on the CED technology, the shortening of the line end is reduced, and moreover, the LER or the minimum resolution is enhanced.

Figure 9:
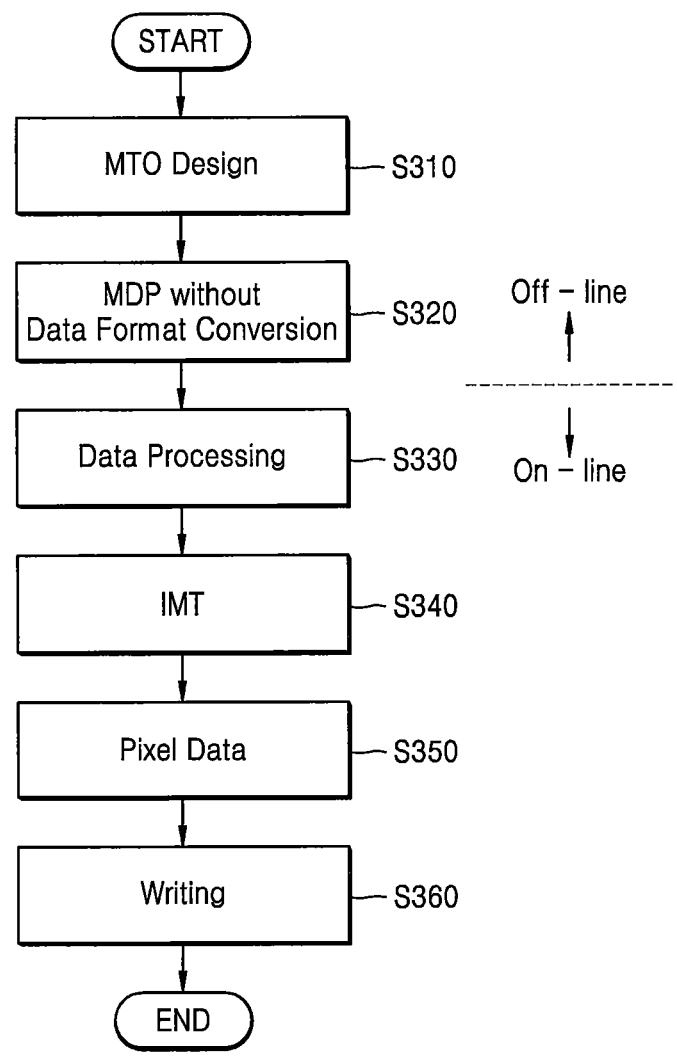
FIG. 9 is a flowchart of an exposure method using an e-beam, according to an embodiment of the inventive concept.

FIG. 9 is a flowchart of an exposure method using an e-beam, according to an embodiment of the inventive concept. Referring to FIG. 9, similarly to FIG. 1, MTO design data is first received in operation S110. Subsequently, similarly to FIG. 1, MDP is performed in operation S320. That is, in the exposure method according to the present embodiment, the MDP may perform only a simple process such as a job deck without performing a process, which takes long, such as format conversion or MPC. Then, in operation S330, data processing is performed in the exposure equipment.

After the data processing is performed, the IMT is performed on mask data in operation S340. The IMT may be defined by merging the PEC, the MPC, and the M-CED technologies. In the exposure method according to the present embodiment, dose-related corrections may be integratedly performed in the exposure equipment. Hereinabove, the rule base has been described in association with the CED technology. However, similarly to other corrections, the IMT according to the present embodiment may fundamentally include the M-CED technology that is the model base. On the other hand, the IMT may be differently defined by a user. For example, only the M-CED technology may be defined as the IMT.

As described above, in the model base, it is not required to calculate the number of test patterns, and thus, time and cost are reduced. Therefore, an IMT performing stage according to the present embodiment integratedly performs dose-related corrections by using the model base, and thus more quickly performs an exposure process.

After the IMT performing stage, as in FIG. 1 or 4, pixel data is generated in operation S350, and e-beam writing is performed by using the generated pixel data in operation S360. In the exposure method according to the present embodiment, since MPC is performed in the exposure equipment, as in the flowchart of FIG. 2, data is divided into shape data and density data by the distributor, the IMT is performed for the density data, and the density data is merged with bitmap data obtained by conversion based on rasterization, thereby generating the pixel data.

Figure 10:
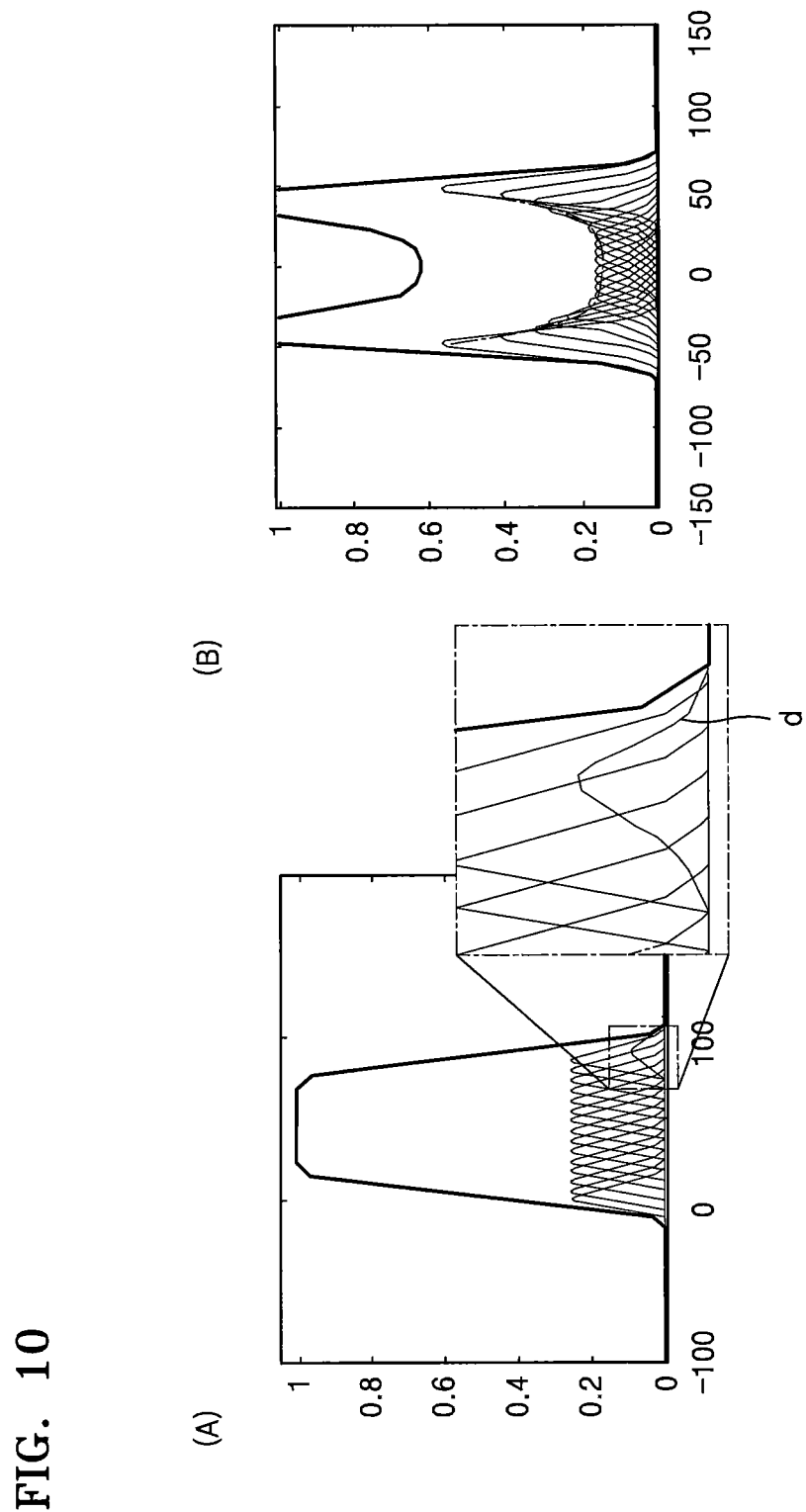
FIG. 10 is a graph for describing a concept of a model-based CED (M-CED) technology applied to an exposure method using an e-beam, according to an embodiment of the inventive concept.

FIG. 10 is a graph for describing a concept of the M-CED technology applied to an exposure method using an e-beam, according to an embodiment of the inventive concept. Referring to FIG. 10, as described above with reference to FIG. 5, in a case of using the MBMW, a width and a shape of intensities of all beams may be adjusted by adjusting an intensity of an individual beam. In particular, as described above, the width of the intensities of all the beams may be adjusted by adjusting an outermost individual beam. For example, in the graph of FIG. 10 (A), the width of the intensities of all the beams increases by increasing an intensity of a rightmost individual beam d, or the width of the intensities of all the beams decreases by decreasing the intensity of the rightmost individual beam d.

As shown in FIG. 10 (B), an intensity shape of all beams may be adjusted by adjusting an intensity of each of the individual beams in addition to outermost individual beams. In FIG. 10 (B), intensities of all the beams may have a V-shaped dose form by decreasing intensities of central individual beams and increasing intensities of outermost individual beams.

In order to determine what dose adjustment is performed for a target pattern, as described above, the Λ-shaped dose adjustment is applied to a size equal to or less than a predetermined size, and the V-shaped dose adjustment is applied to a size equal to or more than the predetermined size. The approach above may cause unpredicted errors based on various types of patterns and peripheral pattern densities.

Therefore, patterns are each modeled by using a certain function, and factors which have a certain rule and are used for dose adjustment are optimized, whereby dose adjustment for enhancing a quality of a pattern is determined. As described above, adjusting a dose through modeling according to corresponding patterns may be defined as M-CED.

As an example of the M-CED, a method that determines dose adjustment by using an error function E will be briefly described. First, the error function E may be defined by the following Equation (1):

$$E = \left| F(x, y) - \left[ \sum_{n=1}^{N} \{W_n \cdot G_n(x, y)\} \otimes M(x, y) \right]_{I=I_{th}} \right| \quad (1)$$

where $G_n(x,y)$ denotes beam data, $W_n$ denotes a weight factor for the beam data, an index "n" denotes shot information, $M(x,y)$ denotes a mask model, $F(x,y)$ denotes a target contour of a mask, and Ith denotes the intensity threshold value. Also, when a value of the error function E is minimized, namely, when a difference between $F(x,y)$ and convolution integration "⊗" in the intensity threshold value "Ith" is minimized, a dose margin is maximized, and thus, a quality of a pattern is enhanced.

As a result, dose adjustment may be determined by optimizing $G_n(x,y)$ and $W_n$, which is data for an individual beam in order for the error function E to be minimized. Also, $G_n(x,y)$ and $W_n$ are optimized so as to minimize the error function E and the above-described dose latitude "$D_{latitude}$", thereby enhancing a quality of a pattern. Furthermore, minimizing all doses may be considered for reducing energy. In the present embodiment, using the error function is merely an example, and appropriate dose adjustment may be determined by using various modeling functions. Since patterns are modeled by using a function and a dose is previously adjusted without using a result of a generated pattern, the term "inverse" may be added.

Figure 11:
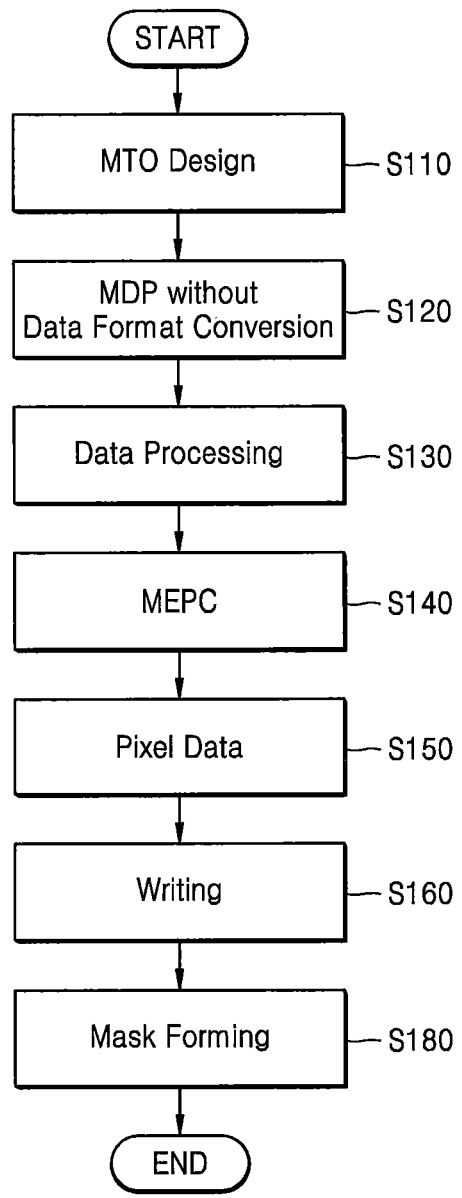
FIGS. 11 to 13 are flowcharts of a mask manufacturing method according to an embodiment of the inventive concept.
Figure 12:
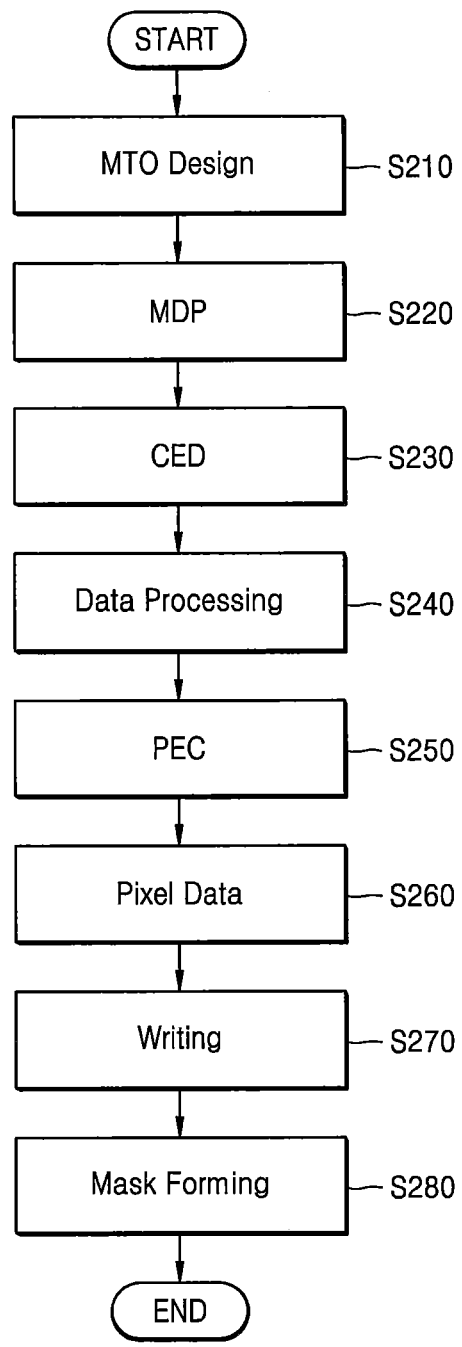
Figure 13:
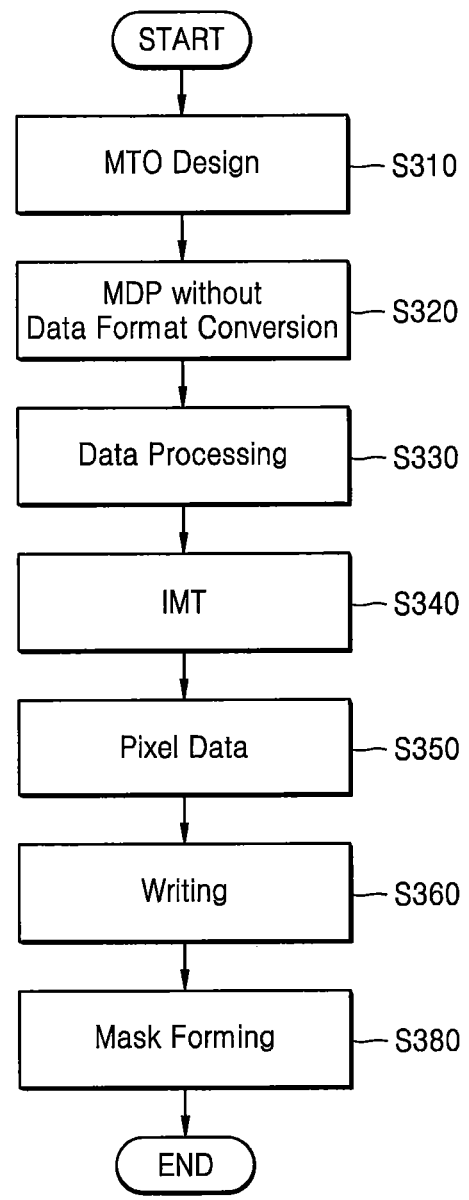

FIGS. 11 to 13 are flowcharts of a mask manufacturing method according to an embodiment of the inventive concept. Referring to FIG. 11, as described above with reference to FIG. 1, several process stages (S110 to S150) are performed, and e-beam writing is performed in operation S160. Here, the e-beam writing may denote irradiating an e-beam onto a mask original form, based on pixel data. The e-beam writing may be performed as "gray writing" by using the MBMW. After the e-beam writing is performed, a mask is formed by performing a series of processes in operation S180. The series of processes may include, for example, processes such as development, etching, and cleaning.

For reference, the mask original form may have a structure in which an opaque thin film such as chrome is coated on a transparent base layer such as glass or melt silica. Before an exposure process, a resist film having an etching resistance is coated on the chrome film. In an e-beam writing process, an e-beam may be irradiated onto the resist film in a certain pattern, based on pixel data.

In a development process, the resist film reacts on a developing solution sensitively or insensitively. In the development process, removing an exposed resist portion is referred to as positive processing, and only an exposed resist being left is referred to as negative processing. After the development process is completed, in an etching process, surfaces of the mask, which are not covered by the resist film, are exposed to etching chemicals, namely, an etchant. The resist film is formed of a material which endures the etching process, and thus, the resist film may be removed at a lower rate than a removal rate of the chrome film disposed at a lower position for etching chemicals. Etching may be performed by using a liquid (wet) or plasma (dry) chemical agent. An exposed portion of the chrome film is removed through etching, and then, all resists remaining on the mask are removed. Subsequently, a cleaning process may be performed.

The series of processes for forming the mask may include a measurement process and a process of inspecting or repairing a defect. Also, the series of processes may include a pellicle coating process. Here, the pellicle coating process means a process of adhering pellicles for protecting the mask from subsequent pollution during an allowable service life of the mask and in delivering the mask when it is checked through final cleaning and inspection that there are no pollution particles or chemical stains.

Referring to FIG. 12, as described above with reference to FIG. 4, several process stages (S210 to S260) are performed, and e-beam writing is performed in operation S270. Here, the e-beam writing may be performed as gray writing by using the MBMW. In operation S280, a mask is formed by performing a series of processes, for example, development, etching, and cleaning processes.

Referring to FIG. 13, as described above with reference to FIG. 9, several process stages (S310 to S350) are performed, and e-beam writing is performed in operation S360. Here, the e-beam writing may be performed as gray writing by using the MBMW. In operation S380, a mask is formed by performing a series of processes, for example, development, etching, and cleaning processes.

Figure 14:
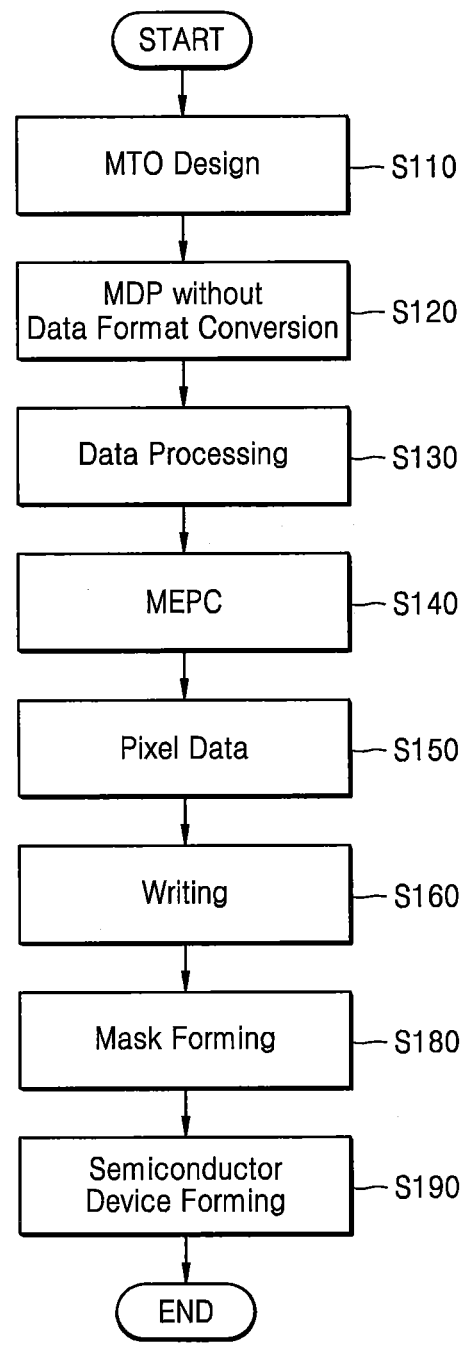
FIGS. 14 to 16 are flowcharts of a method for manufacturing semiconductor devices according to embodiments of the inventive concept.
Figure 15:
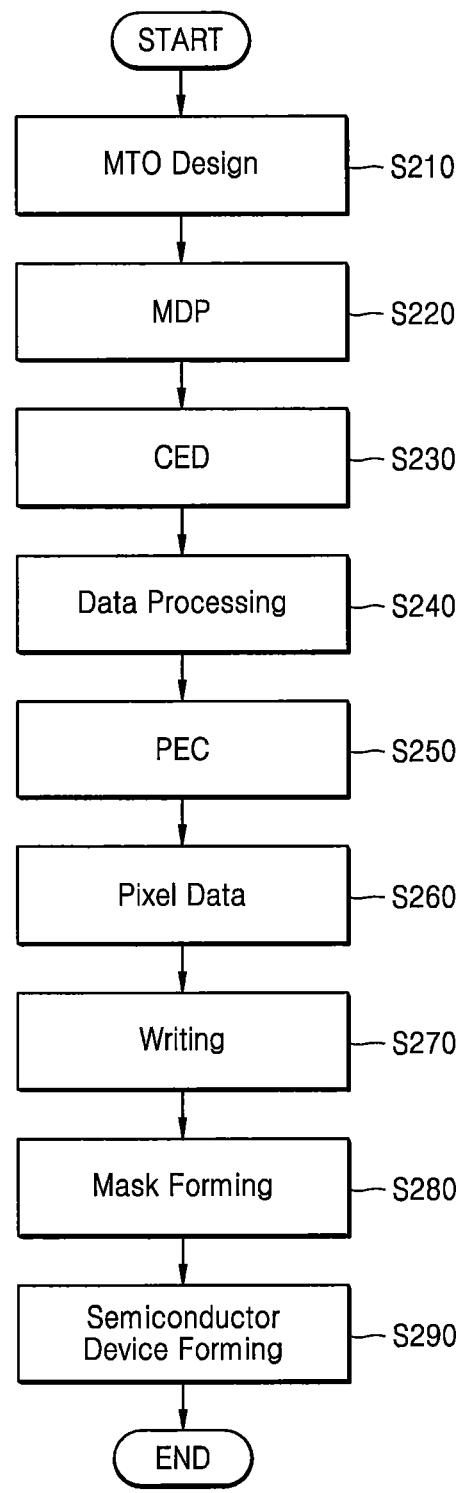
Figure 16:
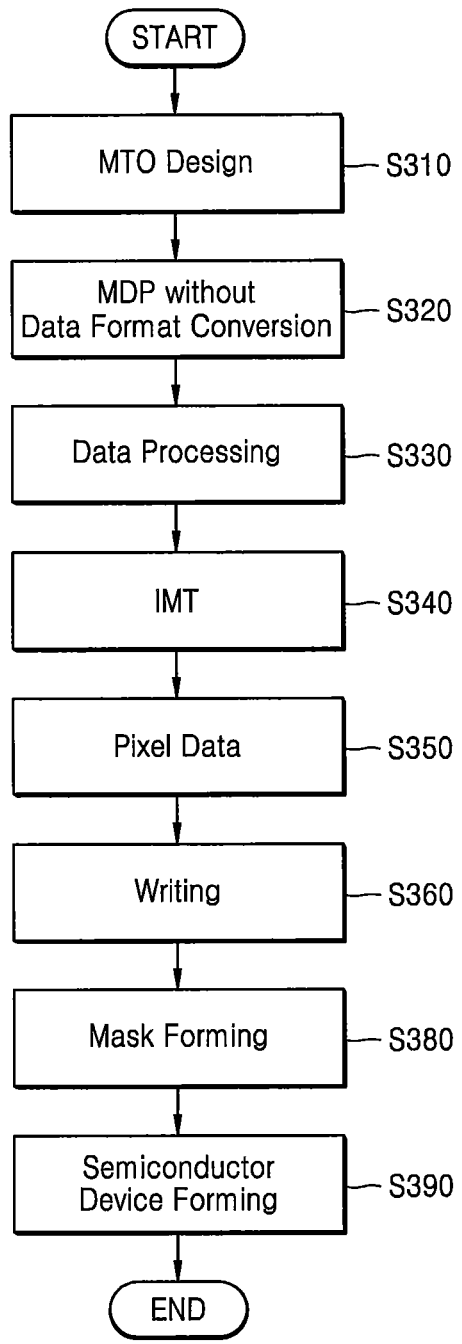

FIGS. 14 to 16 are flowcharts of a method for manufacturing semiconductor device according to an embodiment of the inventive concept.

Referring to FIG. 14, as described above with reference to FIG. 11, several process stages (S110 to S150) are performed, and e-beam writing is performed in operation S160. Subsequently, in operation S180, a mask is formed by performing a series of processes, for example, development, etching, and cleaning processes.

When the mask is completed, a semiconductor device is formed by performing various semiconductor processes on a semiconductor substrate such as a wafer by using the completed mask, in operation S190. For reference, a process using the mask denotes a patterning process using a lithography process, and a desired pattern may be formed on a semiconductor substrate or a material layer through the patterning process using the mask.

The semiconductor processes may include a deposition process, an etching process, an ion process, and a cleaning process. Here, the deposition process may include various material layer forming processes such as chemical vapor deposition (CVD), sputtering, and spin coating. The ion process may include processes such as ion injection, diffusion, and thermal treatment. The semiconductor processes may include a packaging process, in which a semiconductor device is mounted on a printed circuit board (PCB) and is sealed by a sealant, and a test process of testing a semiconductor device or a package.

Referring to FIG. 15, as described above with reference to FIG. 12, several process stages (S210 to S260) are performed, and e-beam writing is performed in operation S270. Subsequently, in operation S280, a mask is formed by performing a series of processes, for example, development, etching, and cleaning processes. When the mask is completed, a semiconductor device is formed by performing various semiconductor processes on a semiconductor substrate such as a wafer by using the completed mask, in operation S290.

Referring to FIG. 16, as described above with reference to FIG. 13, several process stages (S310 to S350) are performed, and e-beam writing is performed in operation S360. Subsequently, in operation S380, a mask is formed by performing a series of processes, for example, development, etching, and cleaning processes. When the mask is completed, a semiconductor device is formed by performing various semiconductor processes on a semiconductor substrate such as a wafer by using the completed mask, in operation S390.

Figure 17:
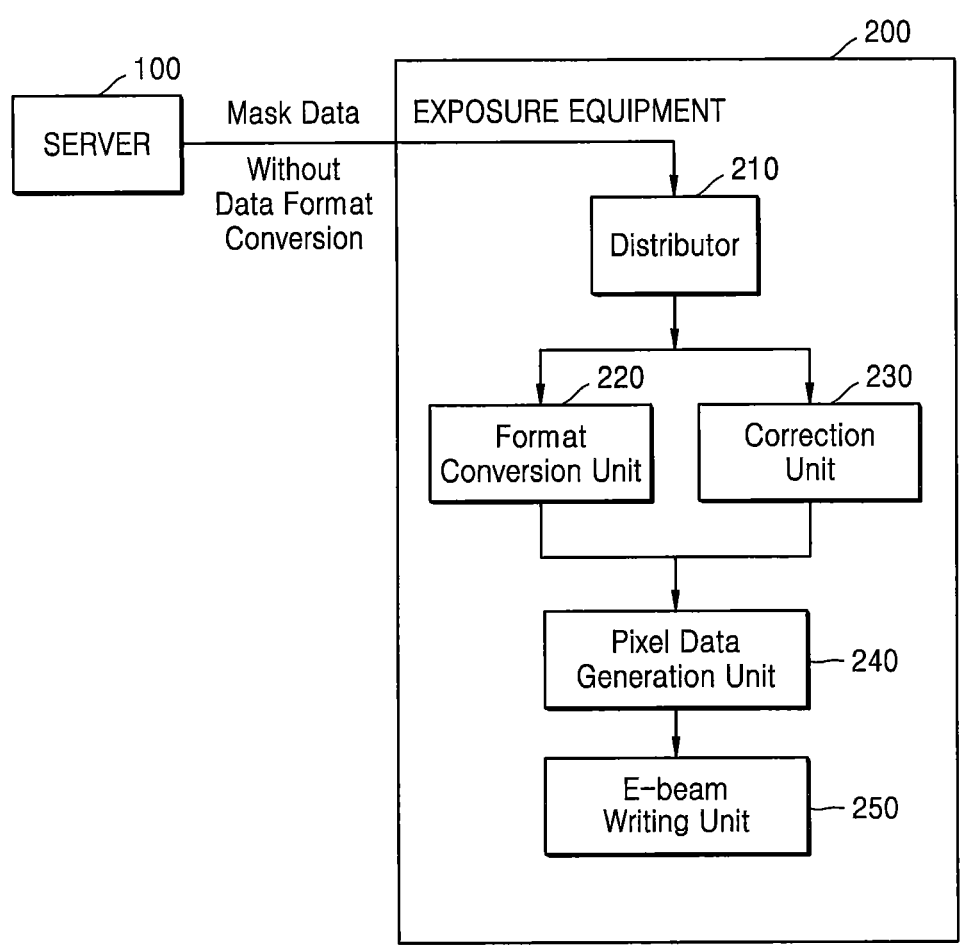
FIG. 17 is a block diagram of an exposure system using an e-beam, according to embodiments of the inventive concept.

FIG. 17 is a block diagram of an exposure system using an e-beam according to an embodiment of the inventive concept. Referring to FIG. 17, the exposure system according to the present embodiment may include a server 100 and exposure equipment 200. The server 100 may be a device such as a central computer to which workers performing a corresponding process input written data when performing an exposure process. For example, data obtained through OPC may be input to the server 100, and moreover, MTO design data for which the OPC is completed may be input to the server 100. In addition, data based on MOP, which is performed off-line, may be input to the server 100.

In the exposure system according to the present embodiment, data based on MDP which is input to the server 100 may be data for which only a simple operation such as a job deck, instead of an operation such as format conversion and MPC, is performed. Therefore, mask data for which only the simple work such as a job deck is performed may be input to the server 100. Since the mask data is data for which only the simple job deck is performed without a format conversion, a format of the mask data may be the same as that of MTO design data.

The exposure equipment 200 may include a distributor 210, a format conversion unit 220, a correction unit 230, a pixel data generation unit 240, and an e-beam writing unit 250. Although not shown, the exposure equipment 200 may further include a data processing unit. The data processing unit performs a preprocessing operation, including grammar check and exposure time prediction, for the mask data input to the exposure equipment 200.

The distributor 210 divides the mask data, on which data processing is performed, into shape data and density data. The format conversion unit 220 converts the shape data, which is vector data, into bitmap data through rasterization.

The correction unit 230 performs dose correction on the density data. In detail, the correction unit 230 generates correction dose maps for the short range, the middle range, and the long range, and merges the correction dose maps to generate a total correction dose map. Dose correction by the correction unit 230 is a concept of merging the PEC with the MPC, and may be performed by a model base. The correction unit 230 may perform dose adjustment based on the M-CED technology. In this case, the correction unit 230 may be considered as performing the IMT.

The pixel data generation unit 240 merges the bitmap data with the total correction dose map to generate pixel data and stores the pixel data in a storage unit. The e-beam writing unit 250 performs e-beam writing on a mask original form by using the stored pixel data. Here, the e-beam writing unit 250 may perform the e-beam writing in a gray writing method by using the MBMW.

The exposure system according to the present embodiment may perform format conversion by exposure unit in real time to perform the e-beam writing for the mask data input to the exposure equipment 200. Therefore, one server may perform an exposure process in real time by using one exposure equipment.

Furthermore, in the exposure system according to the present embodiment, mask data is input from the server to the exposure equipment, the exposure process is performed in real time, and pieces of data are exchanged between the server and the exposure equipment in real time. Therefore, it is not significant to distinguish offline work and online work. This is because an operation which is performed until before mask data is input to the exposure equipment is regarded as an offline concept in the related art, but in the exposure system according to the present embodiment, since pieces of mask data are input through the server in real time and data is exchanged between the server and the exposure equipment in real time, it is ambiguous to distinguish the offline work and the online work.

The exposure method using the e-beam, according to the embodiments of the inventive concept, performs a basic operation such as a job deck without a file format conversion or the MPC in the MDP stage and complexly performs proximity effect correction and mask process correction on-line in the exposure equipment by using the dose correcting method, thereby considerably decreasing a time taken by the e-beam exposure process. Accordingly, a production problem of a mask, which occurs due to an excessive time taken by a MDP stage, is solved.

The exposure method using the e-beam according to the embodiments of the inventive concept enhances a quality of a mask pattern by using the CED technology in which dose adjustment is differently applied to each pattern size. Also, by using the IMT technology, dose-related correction is integratedly performed in the exposure equipment by using the model base, and thus, an accurate and stable exposure process is realized.

Accordingly, as described hereinabove with respect to FIGS. 1-17, methods of forming integrated circuit masks according to some embodiments of the invention may include updating integrated circuit mask data by performing, among other things, at least one of: (i) proximity effect correction (PEC) of errors caused by electron-beam proximity effects; and (ii) mask process correction (MPC) of errors caused during electron-beam exposure of a mask substrate. Thereafter, operations are performed to "write" an integrated circuit mask corresponding to the updated integrated circuit mask data on the mask substrate. This writing operation is performed by exposing the mask substrate to a computer-controlled electron beam (e-beam). According to preferred aspects of these embodiments of the invention, the updating operation include updating integrated circuit mask data by performing both the proximity effect correction (PEC) of errors and the mask process correction (MPC) of errors in the integrated circuit mask data. Moreover, the writing operations may include generating pixel data from the updated integrated circuit mask data and performing an electron-beam writing operation using the pixel data to define the mask.

According to additional embodiments of the invention, the data updating operations are preceded by generating mask tape output (MTO) design data that has undergone an optical proximity correction (OPC) operation. Operations may also be performed to extract shape data and density data from the integrated circuit mask data. Based on these operations, the updating of mask data may include generating corrected electron-beam dose information associated with the density data. According to additional embodiments of the invention, this generating operation may include generating a plurality of correction dose maps for respective short, medium and long ranges and merging the plurality of correction dose maps.

According to still further embodiments of the invention, the updating operations may be preceded by generating mask tape output (MTO) design data, which has undergone an optical proximity correction (OPC) operation, and extracting shape data and density data from the integrated circuit mask data. This extracted shape data can be converted into bitmap data using a rasterization operation and the pixel data may be generated by merging the bitmap data with the extracted density data.

While the inventive concept has been particularly shown and described with reference to exemplary embodiments thereof, it will be understood that various changes in form and details may be made therein without departing from the spirit and scope of the following claims.

What is claimed is:

1. A method of forming an integrated circuit mask, comprising:
    updating integrated circuit mask data associated with a digital representation of a preliminary integrated circuit mask by performing at least one of proximity effect correction (PEC) of errors in a patterned integrated circuit substrate that are caused by electron-beam proximity effects and mask process correction (MPC) of errors in the patterned integrated circuit substrate that are caused during electron-beam exposure of the integrated circuit substrate using the preliminary integrated circuit mask to define at least one pattern thereon; and
    writing the integrated circuit mask, which corresponds to the updated integrated circuit mask data, onto a mask substrate by exposing the mask substrate to an electron beam that defines the integrated circuit mask as a physical pattern on a surface of the mask substrate, said writing comprising generating pixel data from the updated integrated circuit mask data and performing an electron beam writing of the physical pattern using the pixel data;
    wherein said updating is preceded by extracting shape data and density data from the integrated circuit mask data;
    wherein the extracted shape data is converted into bitmap data using a rasterization operation; and
    wherein the pixel data is generated by merging the bitmap data with the extracted density data.

2. The method of claim 1, wherein said updating comprises performing both the proximity effect correction (PEC) of errors and the mask process correction (MPC) of errors.

3. A method of forming an integrated circuit mask, comprising:
    updating integrated circuit mask data associated with a digital representation of a preliminary integrated circuit mask by performing at least one of proximity effect correction (PEC) of errors in a patterned integrated circuit substrate that are caused by electron-beam proximity effects and mask process correction (MPC) of errors in the patterned integrated circuit substrate that are caused during electron-beam exposure of the integrated circuit substrate using the preliminary integrated circuit mask to define at least one pattern thereon; and
    writing the integrated circuit mask, which corresponds to the updated integrated circuit mask data, onto a mask substrate by exposing the mask substrate to an electron beam that defines the integrated circuit mask as a physical pattern on a surface of the mask substrate, said writing comprising generating pixel data from the updated integrated circuit mask data and performing an electron beam writing of the physical pattern using the pixel data;
    wherein said updating is preceded by extracting shape data and density data from the integrated circuit mask data and generating mask tape output (MTO) design data that has undergone an optical proximity correction (OPC) operation;
    wherein the extracted shape data is converted into bitmap data using a rasterization operation; and
    wherein the pixel data is generated by merging the bitmap data with the extracted density data.

4. The method of claim 1, wherein said updating comprises generating corrected electron-beam dose information associated with the density data.

5. The method of claim 4, wherein said generating corrected electron-beam dose information comprises generating a plurality of correction dose maps for respective short, medium and long ranges.

6. The method of claim 5, wherein said generating corrected electron-beam dose information comprises merging the plurality of correction dose maps.

7. The method of claim 1, wherein said writing comprises exposing the mask substrate to an electron beam using a multi-beam mask writer (MBMW).

* * * * *